(12) United States Patent
Ikeda

(10) Patent No.: US 11,309,250 B2
(45) Date of Patent: Apr. 19, 2022

(54) ELECTRONIC MODULE

(71) Applicant: SHINDENGEN ELECTRIC MANUFACTURING CO., LTD., Tokyo (JP)

(72) Inventor: Kosuke Ikeda, Saitama (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 16/962,492

(22) PCT Filed: Jan. 17, 2018

(86) PCT No.: PCT/JP2018/001168
§ 371 (c)(1),
(2) Date: Jul. 15, 2020

(87) PCT Pub. No.: WO2019/142257
PCT Pub. Date: Jul. 25, 2019

(65) Prior Publication Data
US 2021/0091004 A1 Mar. 25, 2021

(51) Int. Cl.
*H01L 23/538* (2006.01)
*H01L 23/31* (2006.01)
*H01L 23/00* (2006.01)

(52) U.S. Cl.
CPC ........ *H01L 23/538* (2013.01); *H01L 23/3121* (2013.01); *H01L 24/48* (2013.01)

(58) Field of Classification Search
CPC ............. H01L 23/538; H01L 23/49562; H01L 23/3121; H01L 25/0655; H01L 23/49575; H01L 2924/14; H01L 2224/48137; H01L 2924/1305; H01L 24/48; H01L 23/49551;
(Continued)

(56) References Cited

U.S. PATENT DOCUMENTS

| 5,376,909 | A | 12/1994 | Nelson et al. |
| 6,201,297 | B1 | 3/2001 | Masuda |
| 9,431,326 | B2 * | 8/2016 | Denta ..................... H01L 21/50 |

(Continued)

FOREIGN PATENT DOCUMENTS

| CN | 107527892 A | 12/2017 |
| JP | H04199552 A | 7/1992 |

(Continued)

OTHER PUBLICATIONS

International Search Report in the international application No. PCT/JP2018/001168, dated Mar. 20, 2018, and its English translation provided by WIPO.

(Continued)

*Primary Examiner* — Jasmine J Clark
(74) *Attorney, Agent, or Firm* — Ladas & Parry, LLP

(57) ABSTRACT

An electronic module has a first substrate 11; an electronic element 13, 23 provided on one side of the first substrate 11; a sealing part 90 that seals at least the electronic element 13, 23; a connection terminal 110 electrically connected to the electronic element 13, 23 and exposed from a side surface of the sealing part 90; and a stress relaxation terminal 150, which is not electrically connected to the electronic element 13, 23, exposed from the side surface of the sealing part 90.

8 Claims, 11 Drawing Sheets

(58) Field of Classification Search
CPC . H01L 23/49513; H01L 23/373; H01L 25/07; H01L 25/18
See application file for complete search history.

(56) References Cited

U.S. PATENT DOCUMENTS

| | | | |
|---|---|---|---|
| 2008/0119065 A1 | 5/2008 | Takakusaki et al. | |
| 2010/0140786 A1 | 6/2010 | Lee et al. | |
| 2012/0074552 A1 | 3/2012 | Mashimo et al. | |
| 2014/0374889 A1* | 12/2014 | Denta | H01L 23/49517 257/666 |
| 2016/0079221 A1 | 3/2016 | Inokuchi et al. | |
| 2016/0095213 A1 | 3/2016 | Otsubo et al. | |
| 2017/0372977 A1 | 12/2017 | Tamai et al. | |
| 2018/0047649 A1* | 2/2018 | Bando | H01L 23/49575 |

FOREIGN PATENT DOCUMENTS

| | | |
|---|---|---|
| JP | H10242368 A | 9/1998 |
| JP | 2006173649 A | 6/2006 |
| JP | 2014045157 A | 3/2014 |
| JP | 2014165425 A | 9/2014 |
| JP | 2016072281 A | 5/2016 |
| WO | 2015001648 A1 | 1/2015 |
| WO | 2015107804 A1 | 7/2015 |
| WO | 2016174908 A1 | 11/2016 |

OTHER PUBLICATIONS

Written Opinion of the international application No. PCT/JP2018/001168, dated Mar. 27, 2018, and its English translation provided by Google Translate.

Search Report for Dutch Patent Application 2022346 dated Jul. 22, 2020, and its English translation provided by the Patent Office of the Netherlands.

First Office action for Taiwanese Patent Application 10820787950, dated Aug. 20, 2019 and its English Translation provided by Google Translate.

Notice of Allowance for Japanese Patent Application 2018-538252, dated Sep. 10, 2019 and its English Translation provided by Google Translate.

* cited by examiner

SECOND DIRECTION

THIRD DIRECTION

FIG. 9
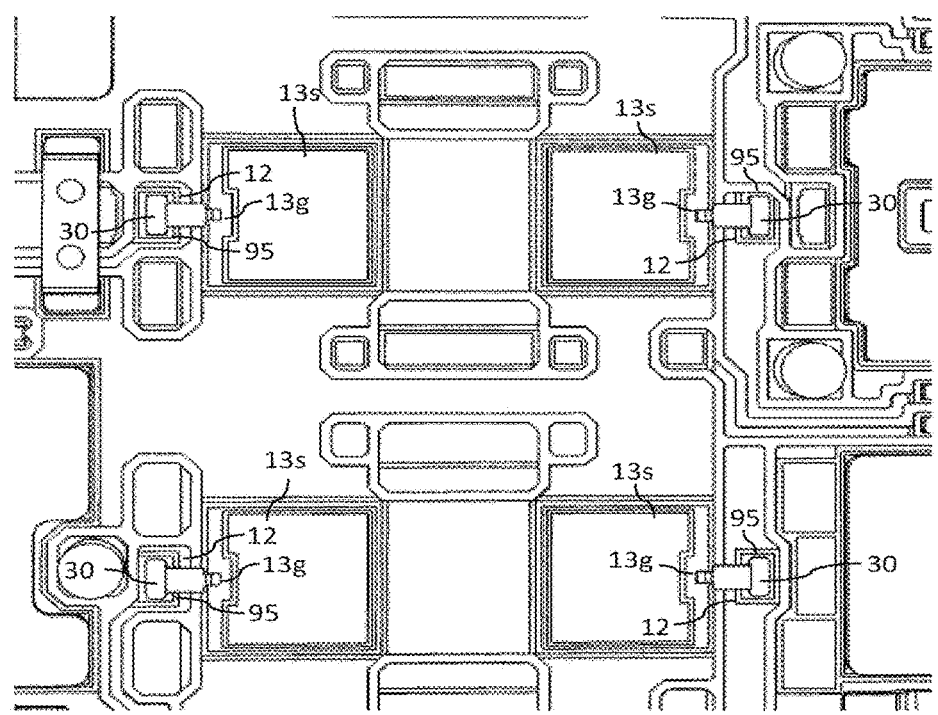
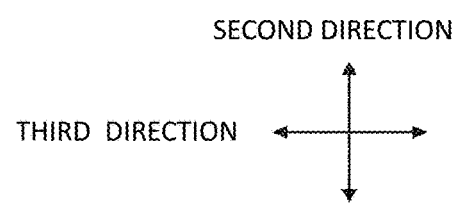

FIG. 10
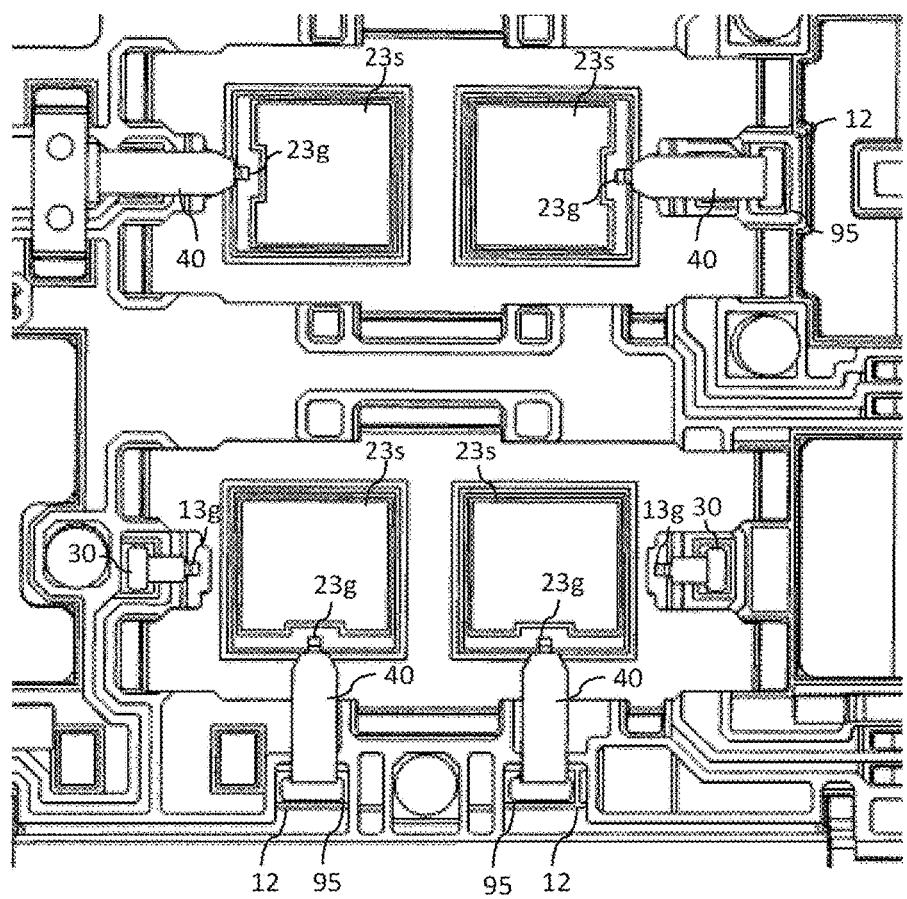
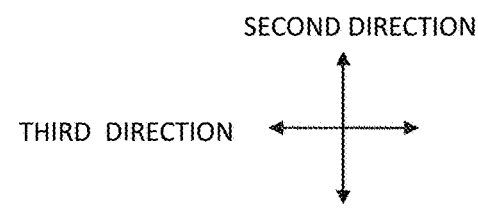

ELECTRONIC MODULE

CROSS-REFERENCE TO RELATED APPLICATION

The present application is the U.S. national phase of PCT Application No. PCT/JP2018/001168 filed on Jan. 17, 2018, the disclosure of which is incorporated herein by reference in its entirety.

TECHNICAL FIELD

The present invention relates to an electronic module having an electronic element included in a sealing part and having a connection terminal connected to the electronic element.

BACKGROUND ART

An electronic module in which a plurality of electronic elements are provided in a sealing resin is conventionally known (for example, see JP 2014-45157 A). There is a need to increase the number of electronic elements in such an electronic module.

As a means for providing more electronic elements, it is conceivable to adopt an aspect of stacking electronic elements in a layered shape. In this case, it is conceivable to provide another electronic element (second electronic element) on one side (for example, a front side) of the electronic element (first electronic element). In addition, when the aspect of stacking the electronic elements in the layered shape is not adopted as described above or when more electronic elements are enclosed in spite of adopting the aspect of stacking the electronic elements in the layered shape, a size of a substrate in an in-plane direction becomes large. When the size of the substrate in the in-plane direction becomes large as described above, the substrate may be warped in a heat treatment process.

In this regard, in order to prevent the warpage of the substrate, for example, it has been suggested that a thickness of a metal circuit board on which a circuit pattern is formed is made larger than a thickness of a metal heat sink and a surface area of a surface of the metal heat sink on a side opposite to a ceramic substrate is made larger than a surface area of a surface of the metal circuit board on a side opposite to the ceramic substrate to suppress warpage of the ceramic substrate due to thermal stress generated in the ceramic substrate (JP 2016-72281 A). In addition, it has been suggested that insulating circuit boards are electrically connected to each other by a conductive member going beyond a bar section, a barrier rib section of an upper cover presses the bar section of a resin frame body, and the bar section presses a first outer end section of the insulating circuit boards to suppress warpage of the insulating circuit boards (WO2015/107804).

However, both of the abovementioned prior art literatures are insufficient in terms of suppression of the warpage of the substrate, particularly, warpage at a peripheral part.

SUMMARY OF INVENTION

Technical Problem

The present invention has been made in view of the problem described above, and provides an electronic module capable of preventing warpage of a substrate, particularly, warpage of a peripheral part of a substrate toward an inner side of a sealing part.

Solution to Problem

[Concept 1]
An electronic module may comprise:
a first substrate;
an electronic element provided on one side of the first substrate;
a sealing part that seals at least the electronic element;
a connection terminal electrically connected to the electronic element and exposed from a side surface of the sealing part; and
a stress relaxation terminal, which is not electrically connected to the electronic element, exposed from the side surface of the sealing part

[Concept 2]
In the electronic module according to concept 1,
the connection terminal may have a control terminal for inputting a control signal to the electronic element, and
a width of the stress relaxation terminal may be wider than a width of the control terminal.

[Concept 3]
In the electronic module according to concept 1 or 2,
the connection terminal may have a power terminal for supplying power to the electronic element and
a width of the stress relaxation terminal may be narrower than a width of the power terminal.

[Concept 4]
In the electronic module according to any one of concepts 1 to 3,
the electronic element may have a first electronic element and a second electronic element provided on one side of the first electronic element,
the stress relaxation terminal may not be electrically connected to the first electronic element and the second electronic element.

[Concept 5]
An electronic module according to concept 4 may further comprise:
a second conductor layer provided on one side of the second electronic element; and
a second substrate provided on one side of the second conductor layer, wherein
the stress relaxation terminal may have a stress relaxation terminal base end part provided on the second conductor layer, a stress relaxation terminal outer part at least a portion of which is exposed from the sealing part, and a stress relaxation terminal bent part provided between the stress relaxation terminal base end part and the stress relaxation terminal outer part and bent toward one side at a side of the stress relaxation terminal base end part.

[Concept 6]
In the electronic module according to concept 5,
a non-connected conductor layer that is not electrically connected to the first electronic element and the second electronic element may be provided on one side of the first substrate.

[Concept 7]
In the electronic module according to any one of concepts 1 to 6,
the connection terminal may have a plurality of power terminals for supplying power to the first electronic element or the second electronic element, and at least one power terminal may have a power terminal base end part electrically connected to the second conductor layer, a power terminal outer part at least a portion of which is exposed from the sealing part, and a power terminal bent part provided between the power terminal base end part and the power terminal outer part and bent toward one side at a side of the power terminal base end part.

[Concept 8]

In the electronic module according to any one of concepts 1 to 7, the connection terminal may have a power terminal for supplying power to the first electronic element or the second electronic element, and the stress relaxation terminal may be provided at a peripherally outer side of the power terminal in a plane direction.

[Concept 9]

In the electronic module according to any one of concepts 1 to 8, the connection terminal may have a plurality of control terminals for inputting a control signal to the first electronic element or the second electronic element, the stress relaxation terminal may go beyond in an in-plane direction a first side surface or a second side surface, which is a side surface in an opposite side of the first side surface, of the first substrate, and may extend to a peripheral outside of the first substrate, the first substrate may have a third side surface and a fourth side surface extending between the first side surface and the second side surface, at least one of the control terminals may go beyond in an in-plane direction the third side surface or the fourth side surface of the first substrate, and may extend to a peripheral outside of the first substrate.

Advantageous Effects of Invention

In the present invention, the stress relaxation terminal which is not electrically connected to the electronic element and is exposed from the side surface of the sealing part is provided. According to a result confirmed through an experiment conducted by the inventors, the stress relaxation terminal is provided, such that it is possible to prevent the substrate from being warped, particularly, a peripheral part of the substrate from being warped toward an inner side of the sealing part.

BRIEF DESCRIPTION OF DRAWINGS

FIG. 1 is a plan view of an electronic module that can be used in a first embodiment of the present invention, without showing a sealing part, a second substrate, a second heat dissipation layer, and the like.

FIG. 9 is a plan view showing the first electronic element that can be used in the first embodiment of the present invention.

FIG. 10 is a plan view showing the second electronic element that can be used in the first embodiment of the present invention.

DESCRIPTION OF EMBODIMENTS

First Embodiment

<<Configuration>>

Figure 2:
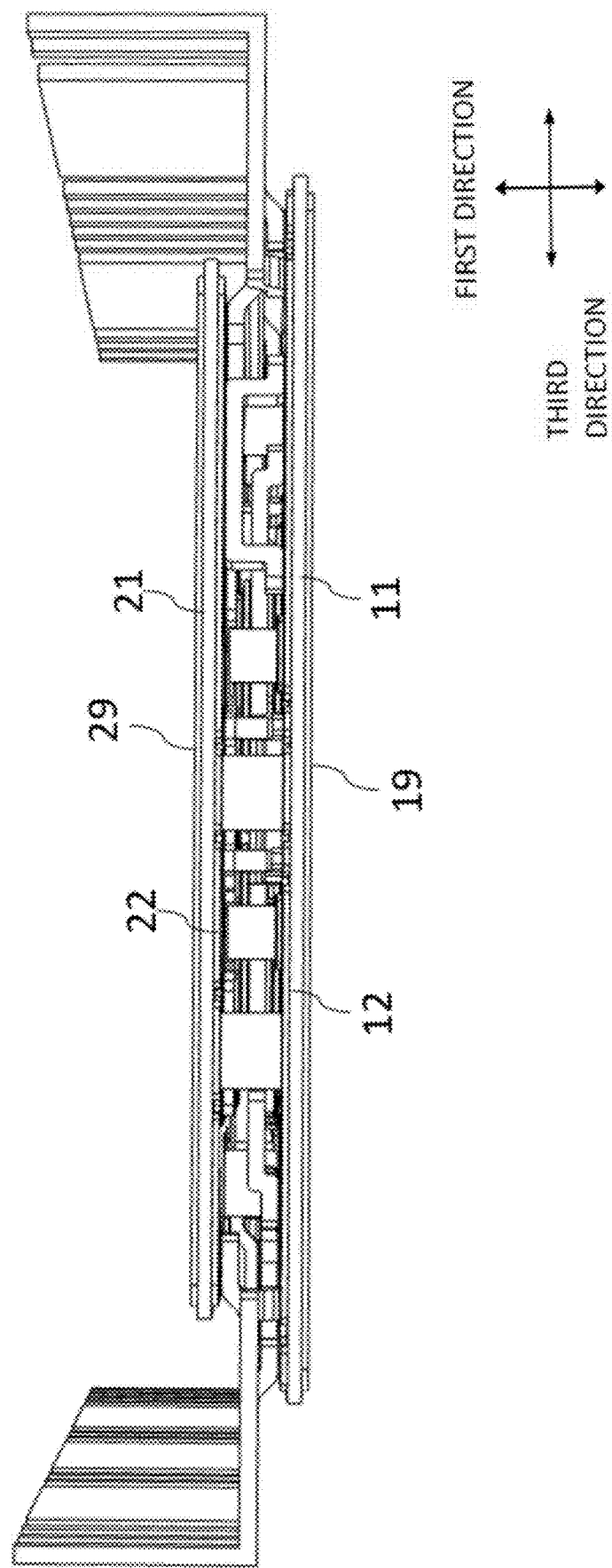
FIG. 2 is a side view of the electronic module that can be used in the first embodiment of the present invention, without showing the sealing part.

In the present embodiment, "one side" refers to an upper side in FIG. 2, and "the other side" refers to a lower side in FIG. 2. Upward and downward directions in FIG. 2 are referred to as a "first direction", frontward and rearward directions of a page are referred to as a "second direction", and leftward and rightward directions are referred to as a "third direction". An in-plane direction including the second direction and the third direction is referred to as an "in-plane direction", and a case of being viewed from one side toward the other side is referred to as a "plane view".

Figure 8:
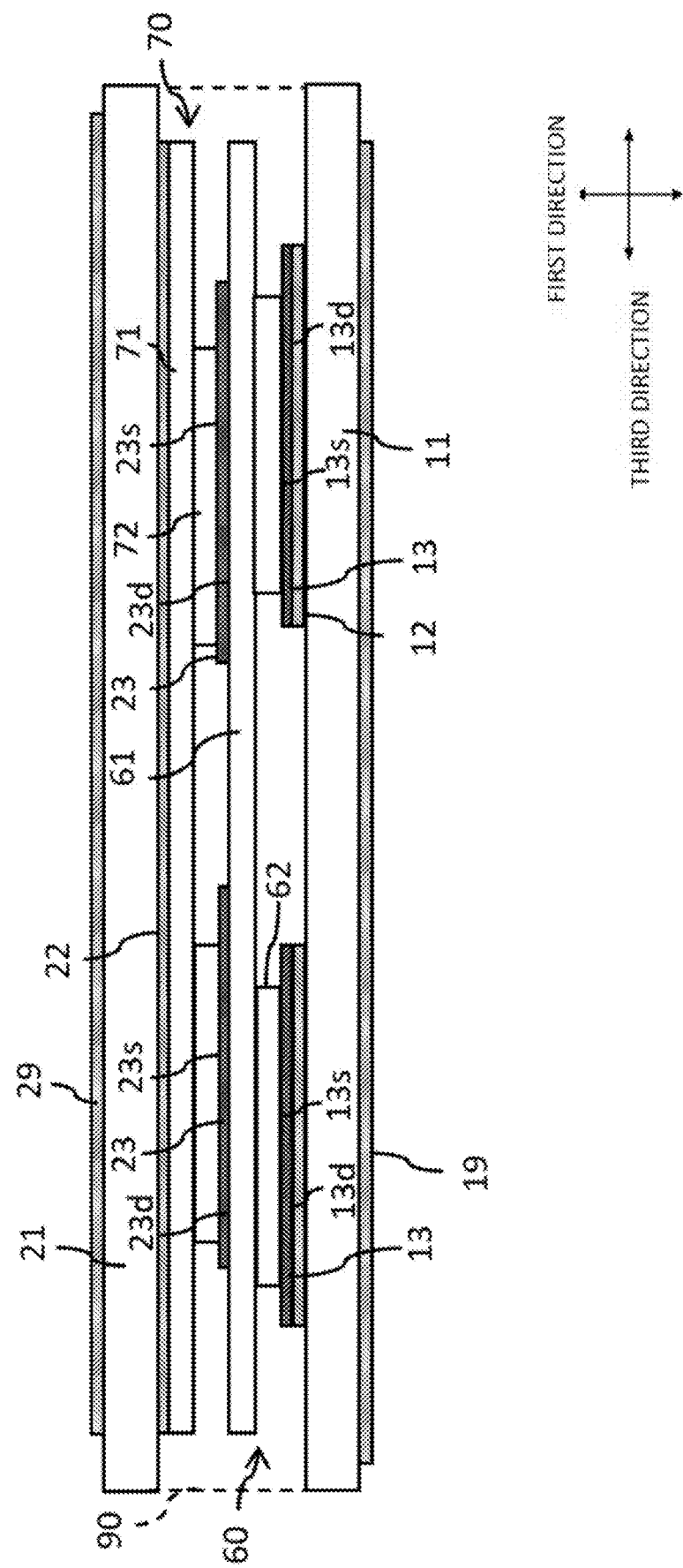
FIG. 8 is a side cross-sectional view showing a relationship among a first electronic element, a first connection body, a second electronic element, a second connection body, and the like that can be used in the first embodiment of the present invention.
Figure 11:
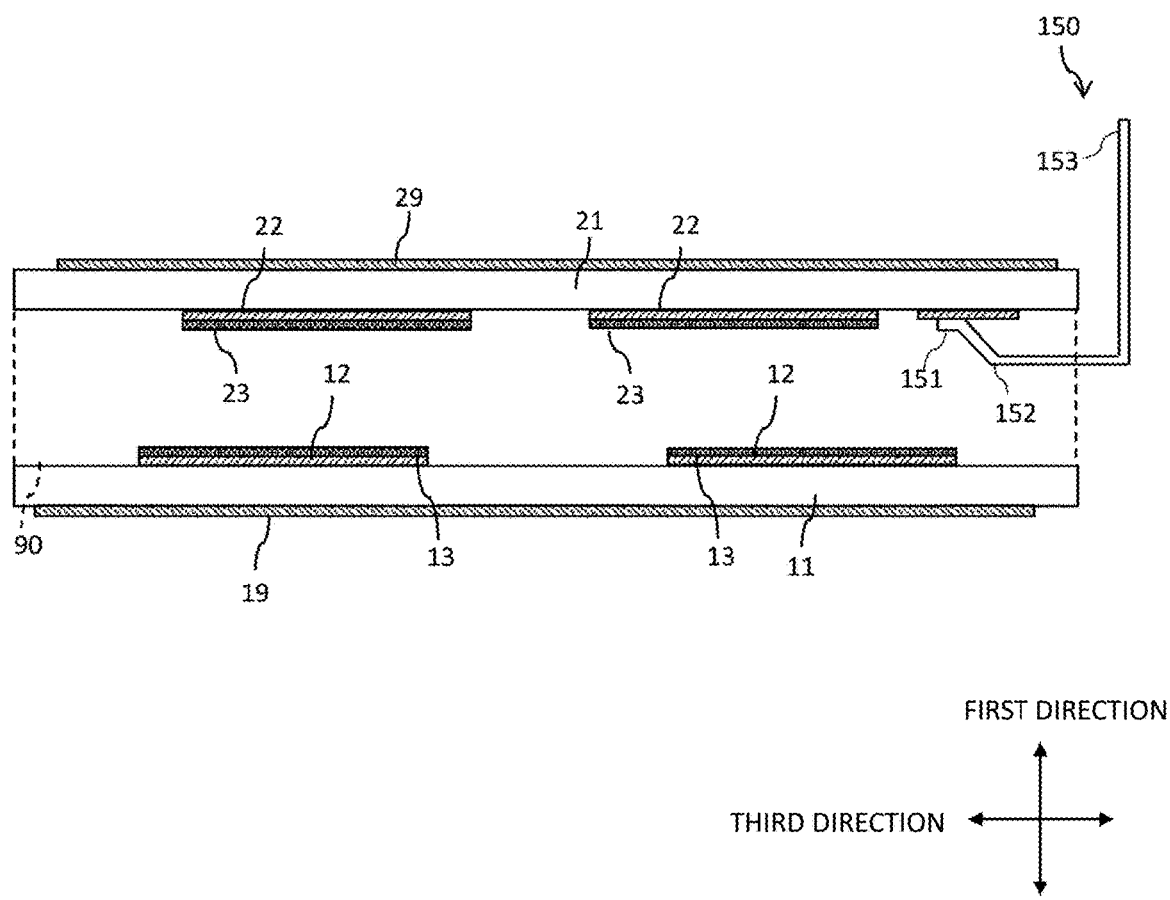
FIG. 11 is a view corresponding to FIG. 8, and is a side cross-sectional view of an electronic module that can be used in a second embodiment of the present invention.

As shown in FIG. 8, an electronic module may have a first heat dissipation layer 19, a first substrate 11 provided on one side of the first heat dissipation layer 19, a first conductor layer 12 provided on one side of the first substrate 11, a first electronic element 13 provided on one side of the first conductor layer 12, a second electronic element 23 provided on one side of the first electronic element 13, a second conductor layer 22 provided on one side of the second electronic element 23, a second substrate 21 provided on one side of the second conductor layer 22, a second heat dissipation layer 29 provided on one side of the second substrate 21, and a sealing part 90 made of a sealing resin or the like that seals the first electronic element 13 and the second electronic element 23.

Both or any one of the first conductor layer 12 and the second conductor layer 22 may be connected to terminals 110 and 150 (see FIG. 1), and tip sides of the terminals 110 and 150 may be exposed to the outside of the sealing part 90 and may be connectable to an external device such as a control board.

Figure 1:
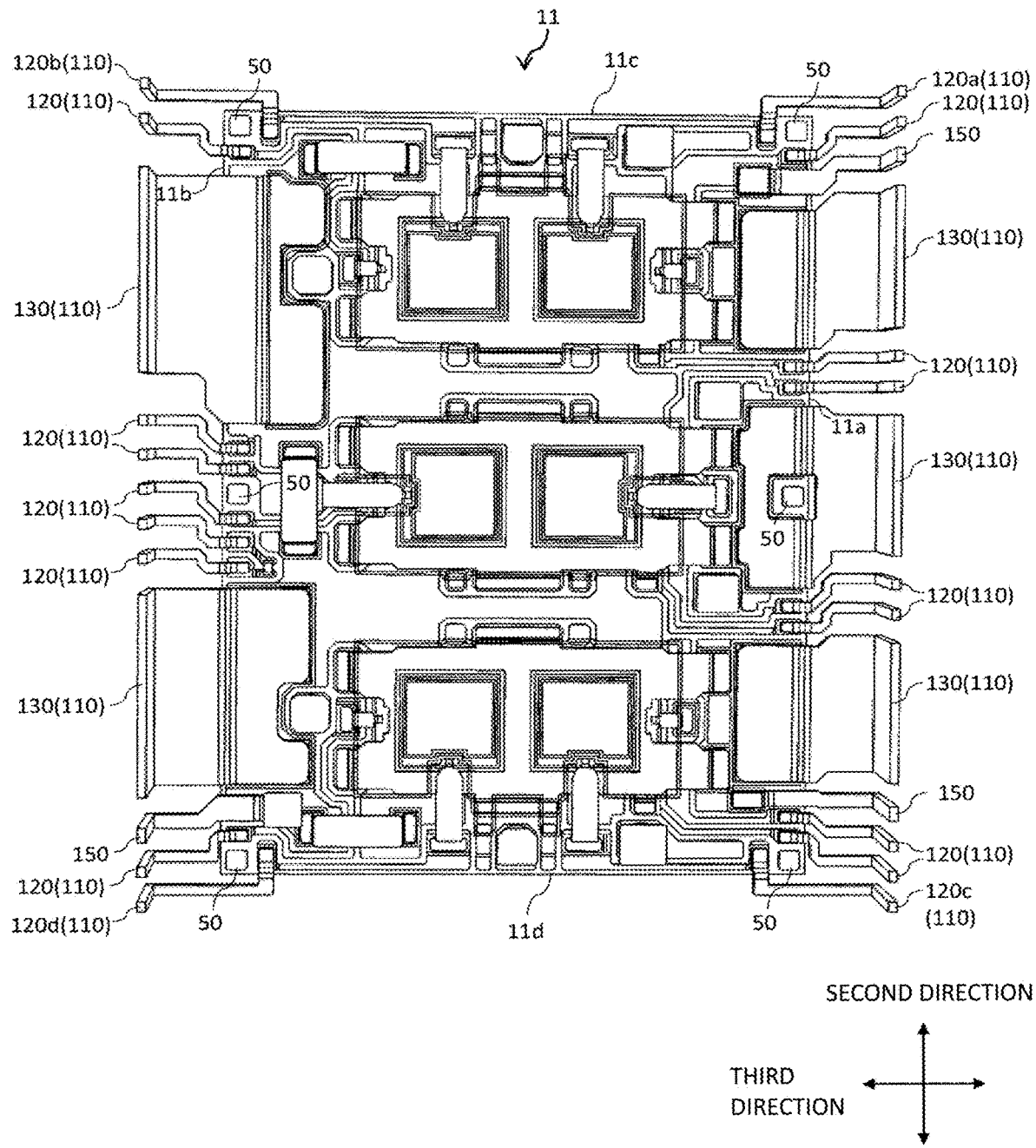

As shown in FIG. 1, the terminals 110 and 150 may have connection terminals 110 electrically connected to the first electronic element 13 or the second electronic element 23 and exposed from side surfaces of the sealing part 90, and stress relaxation terminals 150, which are not electrically connected to either of the first electronic element 13 and the second electronic element 23, exposed from the side surfaces of the sealing part 90.

The connection terminal 110 may have one or plural control terminals 120 for inputting control signals to the first electronic element 13 or the second electronic element 23. A width (which is a length in a short-side direction in the in-plane direction and a length in the second direction of FIG. 1) of the stress relaxation terminal 150 may be wider than the widest portion of a width of the control terminal 120, regardless of a place.

The connection terminal 110 may have one or plural power terminals 130 for supplying power to the first electronic element 13 or the second electronic element 23. The width of the stress relaxation terminal 150 may be narrower than the narrowest portion of a width of the power terminal 130 regardless of a place.

Figure 5:
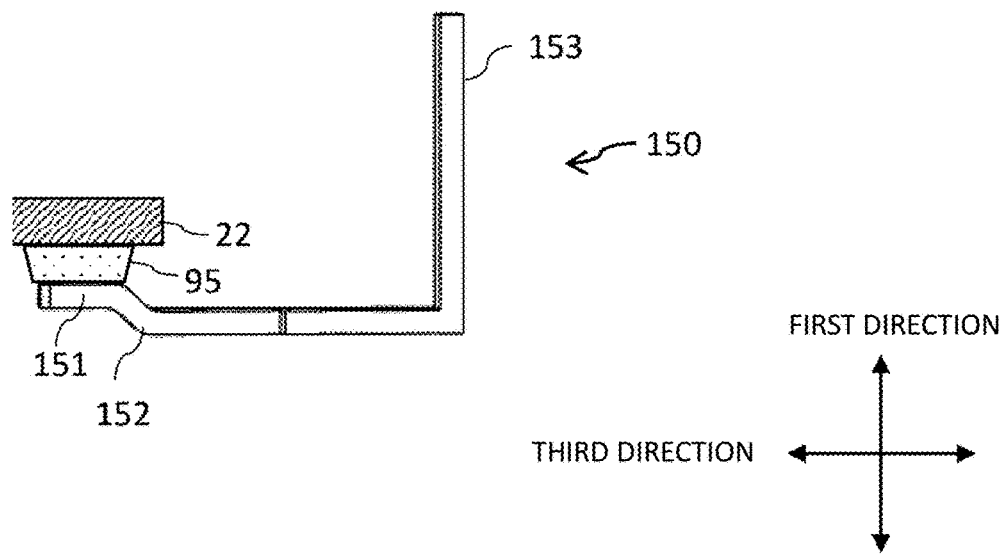
FIG. 5 is a side view of a stress relaxation terminal that can be used in the first embodiment of the present invention.

As shown in FIG. 5, the stress relaxation terminal 150 may have a stress relaxation terminal base end part 151 indirectly provided on the second conductor layer 22 via a conductive adhesive 95, a stress relaxation terminal outer part 153 at least a portion of which is exposed from the sealing part 90, and a stress relaxation terminal bent part 152 provided between the stress relaxation terminal base end part 151 and the stress relaxation terminal outer part 153 and bent toward one side or the other side in the sealing part 90. It should be noted that the stress relaxation terminal base end part 151 may be directly provided on the second conductor layer 22 without providing the conductive adhesive 95 between the stress relaxation terminal base end part 151 and the second conductor layer 22.

Figure 4:
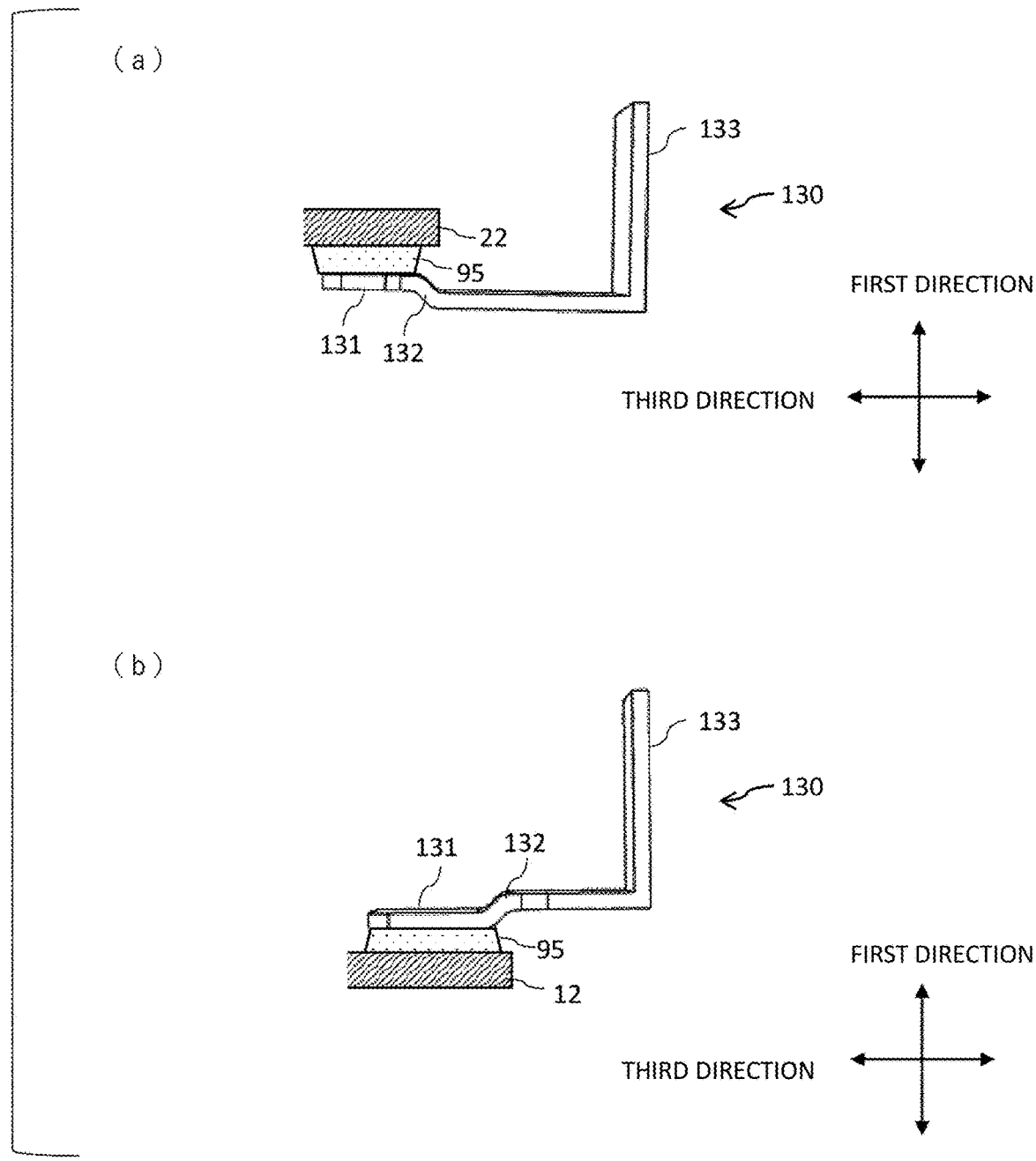
FIG. 4(a) is a side view of a power terminal that can be used in the first embodiment of the present invention.
FIG. 4(b) is a side view of a power terminal of another aspect which can be used in the first embodiment of the present invention.

As shown in FIG. 4, the power terminal 130 may have a power terminal base end part 131 indirectly provided on the conductor layer 12 or 22 via a conductive adhesive 95, a power terminal outer part 133 at least a portion of which is exposed from the sealing part 90, and a power terminal bent part 132 provided between the power terminal base end part 131 and the power terminal outer part 133 and bent from the power terminal base end part 131 toward one side or the other side. In an aspect shown in FIG. 1, an upper left power terminal 130 has the power terminal base end part 131 indirectly provided on the second conductor layer 22 via the conductive adhesive 95 and the power terminal bent part 132 bent from the power terminal base end part 131 toward one side or the other side, as shown in FIG. 4(a). Each of four power terminals 130 other than the upper left power terminal 130 has the power terminal base end part 131 indirectly provided on the first conductor layer 12 via the conductive adhesive 95 and the power terminal bent part 132 bent from the power terminal base end part 131 toward the other side, as shown in FIG. 4(b).

Figure 6:
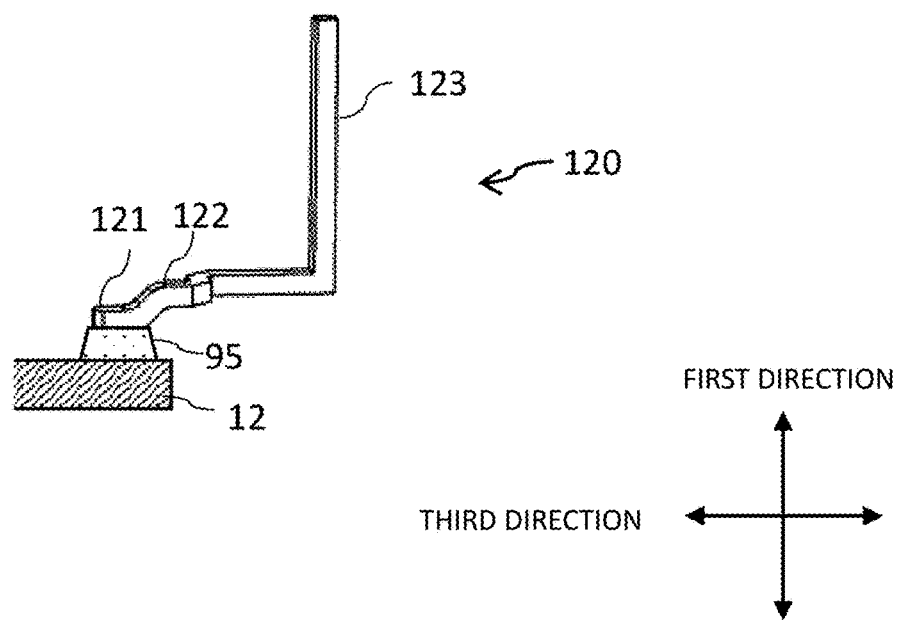
FIG. 6 is a side view of a control terminal that can be used in the first embodiment of the present invention.

The control terminal 120 may have a control terminal base end part 121 indirectly provided on the conductor layer 12 or 22 via a conductive adhesive 95, a control terminal outer part 123 at least a portion of which is exposed from the sealing part 90, and a control terminal bent part 122 provided between the control terminal base end part 121 and the control terminal outer part 123 and bent from the control terminal base end part 121 toward one side or the other side. In the aspect shown in FIG. 1, the control terminal 120 has the control terminal base end part 121 indirectly provided on the first conductor layer 12 via the conductive adhesive 95 and the control terminal bent part 122 bent from the control terminal base end part 121 toward the other side, as shown in FIG. 6.

The control terminal 120 may have a control terminal base end part 121 electrically connected to the first conductor layer 12, a control terminal outer part 123 at least a portion of which is exposed from the sealing part 90, and a control terminal bent part 122 provided between the control terminal base end part 121 and the control terminal outer part 123 and bent toward one side in the sealing part 90.

Figure 3:
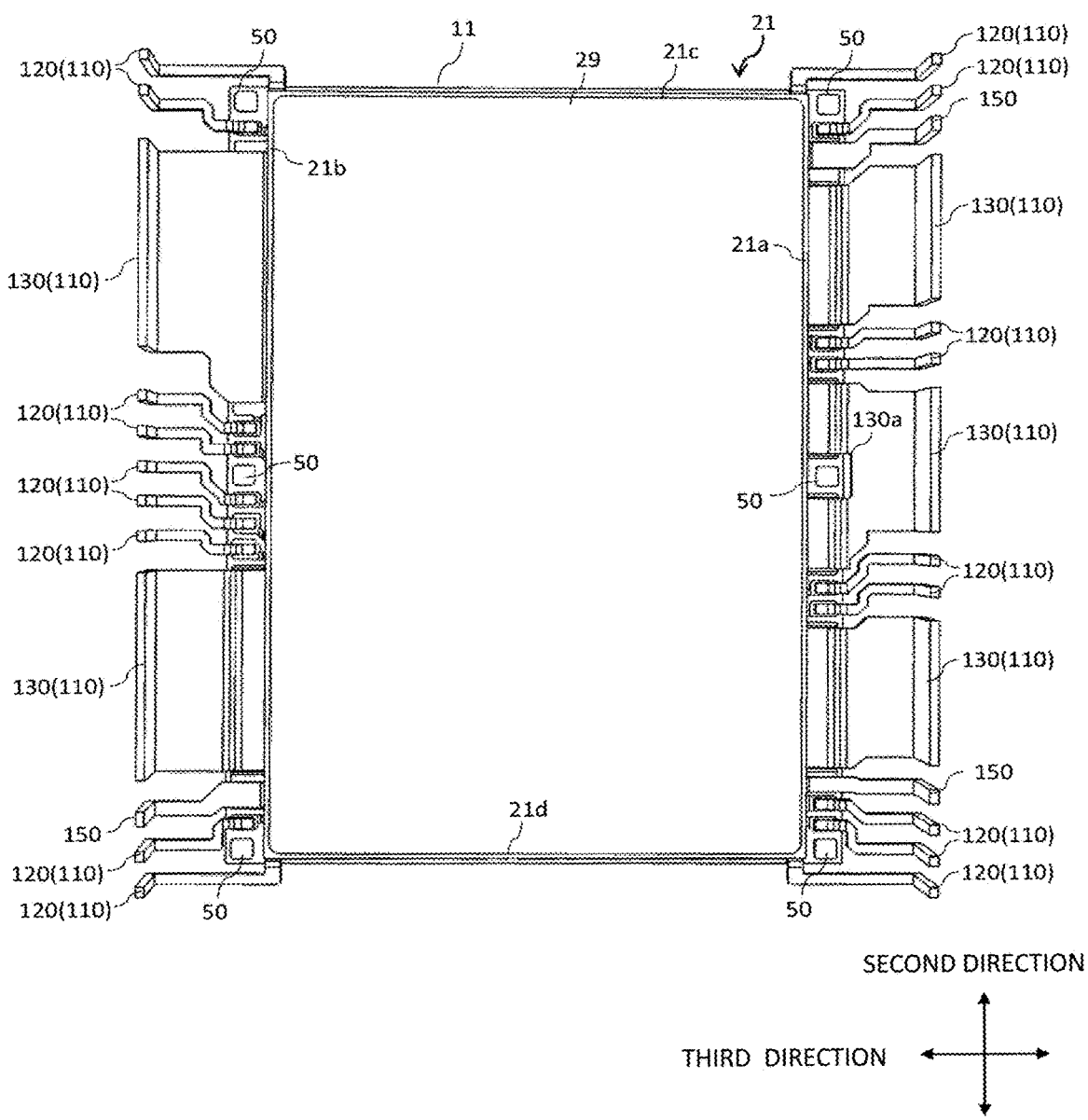
FIG. 3 is a plan view of the electronic module that can be used in the first embodiment of the present invention, without showing the sealing part.

A non-connected conductor layer 50 that is pressed by a metal mold at the time of performing resin sealing and is not electrically connected to the first electronic element 13 and the second electronic element 23 may be provided on one side of the first substrate 11. As shown in FIGS. 2 and 3, a size of the second substrate 21 in an in-plane direction may be smaller than a size of the first substrate 11 in the in-plane direction, and as shown in FIG. 3, the non-connected conductor layer 50 provided on the first substrate 11 may be positioned at an outer side of the first substrate 11 in a plane view.

Figure 7:
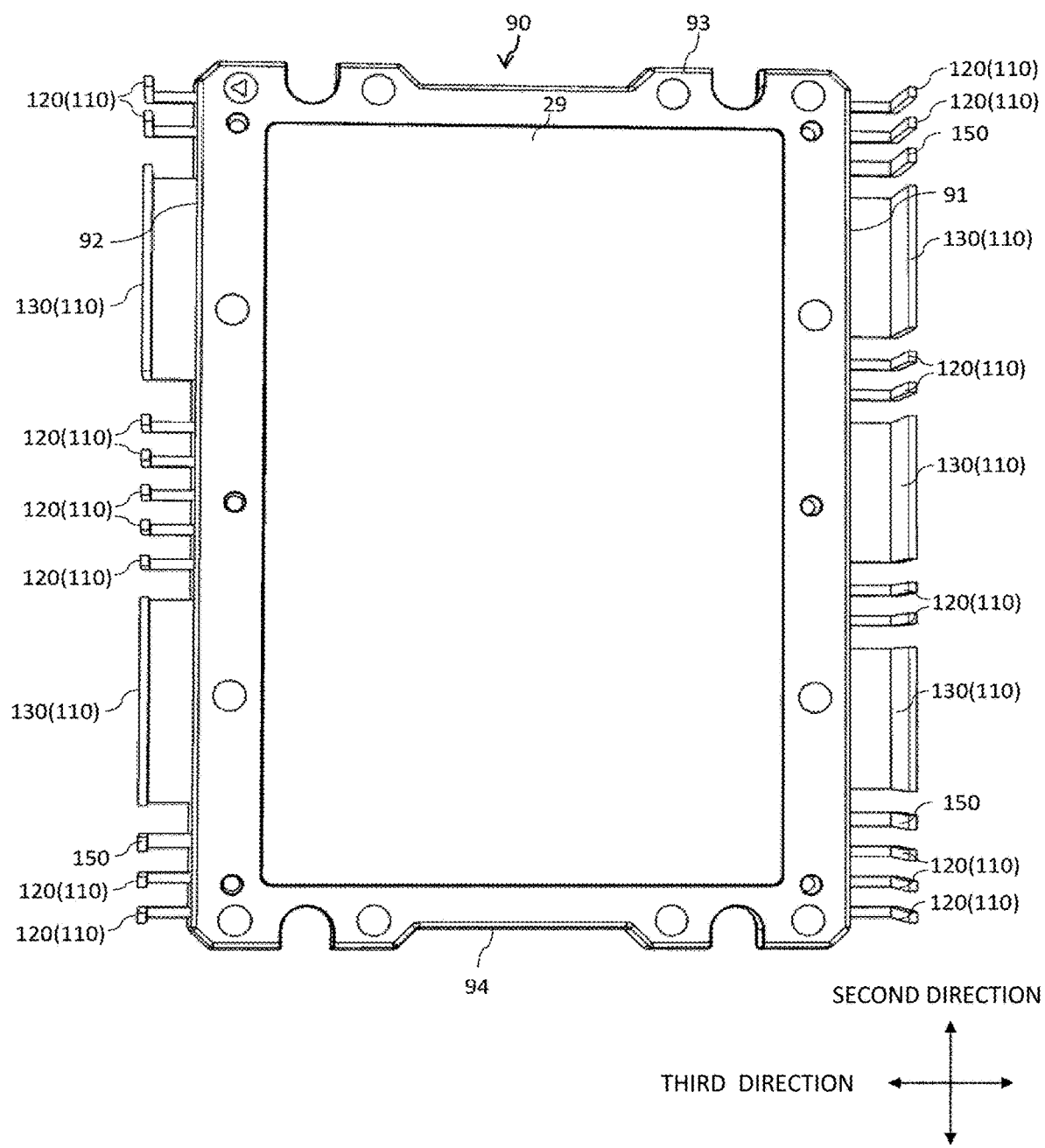
FIG. 7 is a plan view of the electronic module that can be used in the first embodiment of the present invention.

The sealing part 90 may have a substantially rectangular shape in a plane view, as shown in FIG. 7. In the present embodiment, the "substantially rectangular shape" refers to a shape of a rectangle having two pairs of sides facing each other, corner portions in, for example, a plane view may be a right angle or may be rounded, corners may be inclined as shown in FIG. 7, and recesses may be provided in several places of side surfaces as shown in FIG. 7. As shown in FIG. 3, each of the first substrate 11 and the second substrate 21 may have a substantially rectangular shape in a plane view.

The sealing part 90 may have a first side surface 91, a second side surface 92 which is a side surface opposite to the first side surface 91, and a third side surface 93 and a fourth side surface 94 that extend between the first side surface 91 and the second side surface 92. When the sealing part 90 has the substantially rectangular shape in the plane view, the first side surface 91 and the second side surface 92 may be parallel with each other in a plane view, the third side surface 93 and the fourth side surface 94 may be parallel with each other in a plane view, lengths of the first side surface 91 and the second side surface 92 in the plane view may be substantially the same as each other, and lengths of the third side surface 93 and the fourth side surface 94 in the plane view may be substantially the same as each other. In the present embodiment, the "substantially the same" means that a difference between lengths of two side surfaces is within 10% of the longer one, and in the case in which it is mentioned that a length A1 and a length A2 (A1≥A2) are substantially the same as each other, it means that A1×0.9≤A2≤A1. Although an aspect in which the sealing part 90 has the substantially rectangular shape in the plane view has been described in the present embodiment, the sealing part 90 is not limited thereto, and may have a substantially square shape or may have a substantially trapezoidal shape, in the plane view.

The stress relaxation terminal 150 may be provided along the first side surface 91 of the sealing part 90 and/or the second side surface 92 of the sealing part 90 which is a side surface opposite to the first side surface 91.

At least one of the control terminals 120 may be exposed outwardly from the third side surface 93 and/or the fourth side surface 94 of the sealing part 90.

The stress relaxation terminals 150 may be provided at a peripherally outer side of the power terminals 130 in a plane direction. In the aspect shown in FIG. 1, three power terminals 130 are provided on the first side surface 91, one stress relaxation terminal 150 is provided above a power terminal 130 (in the peripherally outer side) positioned at the uppermost portion along the second direction in FIG. 1, and one stress relaxation terminal 150 is provided below a power terminal 130 (in the peripherally outer side) positioned at the lowermost portion along the second direction in FIG. 1.

The first substrate 11 may have a first side surface 11a, a second side surface 11b, a third side surface 11c, and a fourth side surface 11d so as to correspond to the sealing part 90, as shown in FIG. 1. The second substrate 21 may also have a first side surface 21a, a second side surface 21b, a third side surface 21c, and a fourth side surface 21d so as to correspond to the sealing part 90, as shown in FIG. 3.

In the aspect shown in FIG. 1, two stress relaxation terminals 150 go beyond the first side surface of the first substrate 11 in the in-plane direction to extend to the peripheral outside of the first substrate 11. In addition, one control terminal 120a positioned at the upper right of FIG. 1 goes beyond the third side surface 11c of the first substrate 11 in the in-plane direction to extend to the peripheral outside of the first substrate 11 (see FIG. 1), and is exposed outwardly from the first side surface 91 of the sealing part 90 (see FIG. 7). Another control terminal 120b positioned at the upper left of FIG. 1 goes beyond the third side surface 11c of the first substrate 11 in the in-plane direction to extend to the peripheral outside of the first substrate 11 (see FIG. 1), and is exposed outwardly from the second side surface 92 of the sealing part 90 (see FIG. 7). In addition, one control terminal 120c positioned at the lower right of FIG. 1 goes beyond the fourth side surface 11d of the first substrate 11 in the in-plane direction to extend to the peripheral outside of the first substrate 11 (see FIG. 1), and is exposed outwardly from the first side surface 91 of the sealing part 90 (see FIG. 7). Another control terminal 120d positioned at the lower left of FIG. 1 goes beyond the fourth side surface 11d of the first substrate 11 in the in-plane direction to extend to the peripheral outside of the first substrate 11 (see FIG. 1), and is exposed outwardly from the second side surface 92 of the sealing part 90 (see FIG. 7).

In the aspect shown in FIG. 1, seven control terminals 120 go beyond the first side surface 11a of the first substrate 11 in the in-plane direction to extend to the peripheral outside of the first substrate 11 (see FIG. 1), and are exposed outwardly from the first side surface 91 of the sealing part 90 (see FIG. 7). In addition, other seven control terminals 120 go beyond the second side surface 11b of the first substrate 11 in the in-plane direction to extend to the peripheral outside of the first substrate 11 (see FIG. 1), and are exposed outwardly from the second side surface 92 of the sealing part 90 (see FIG. 7). Three power terminals 130 go beyond the first side surface 11a of the first substrate 11 in the in-plane direction to extend to the peripheral outside of the first substrate 11 (see FIG. 1), and are exposed outwardly from the first side surface 91 of the sealing part 90 (see FIG. 7). In addition, two power terminals 130 go beyond the second side surface 11b of the first substrate 11 in the in-plane direction to extend to the peripheral outside of the first substrate 11 (see FIG. 1), and are exposed outwardly from the second side surface 92 of the sealing part 90 (see FIG. 7).

An opening 130a may be provided in a power terminal 130 positioned in the middle of the first side surface 91 of the sealing part 90, and the non-connected conductor layer 50 may become visible through the opening 130a of the power terminal 130 in a plane view. Such an opening 130a is provided, such that it is possible to press the non-connected conductor layer 50 by the metal mold at the time of performing the resin sealing.

As shown in FIG. 8, the electronic module according to the present embodiment may have connection bodies 60 and 70. The connection bodies 60 and 70 may have a first connection body 60 provided between the first electronic element 13 and the second electronic element 23 and a second connection body 70 provided on a side opposite to the first connection body 60 of the second electronic element 23.

The connection bodies 60 and 70 may have head parts 61 and 71 and pillar parts 62 and 72 extending from the head parts 61 and 71 in a thickness direction of the head parts 61 and 71, respectively. In an aspect in which the connection bodies 60 and 70 have the first connection body 60 and the second connection body 70, the first connection body 60 may have a first head part 61 and a first pillar part 62 extending from the first head part 61 in the thickness direction of the first head part 61. In addition, the second connection body 70 may have a second head part 71 and a second pillar part 72 extending from the second head part 71 in the thickness direction of the second head part 71.

A plurality of first conductor layers 12 may be provided on one side of the first substrate 11. Each or any one of the first electronic element 13 and the second electronic element 23 may be a switching element or may be a control element. A metal oxide semiconductor field effect transistor (MOSFET), an insulated gate bipolar transistor (IGBT), or the like may be used as the switching element. Each of the first electronic element 13 and the second electronic element 23 may be formed of a semiconductor element, and a semiconductor material may be silicon, silicon carbide, gallium nitride, or the like.

A conductive adhesive 95 such as a solder may be provided between the first electronic element 13 and the first connection body 60, and the first electronic element 13 and the first connection body 60 may be connected to each other via the conductive adhesive 95. Likewise, a conductive adhesive 95 such as a solder may be provided between the first connection body 60 and the second electronic element 23, and the first connection body 60 and the second electronic element 23 may be connected to each other via the conductive adhesive 95. Likewise, a conductive adhesive 95 such as a solder may be provided between the second electronic element 23 and the second connection body 70, and the second electronic element 23 and the second connection body 70 may be connected to each other via the conductive adhesive 95.

As the first substrate 11 and the second substrate 21, an insulating substrate such as a ceramic substrate and an insulating resin layer can be used. As the conductive adhesive 95, a material containing Ag or Cu as a main component can be used, in addition to the solder. As a material of each of the first connection body 60 and the second connection body 70, a metal such as Cu can be used. As the substrates 11 and 21, for example, a metal substrate on which circuit patterning is performed can be used. In this case, the substrates 11 and 21 also serve as the conductor layers 12 and 22.

When the first electronic element 13 is the switching element such as the MOSFET, as shown in FIGS. 8 and 9, a first gate electrode 13g and a first source electrode 13s may be provided on a surface of the first electronic element adjacent to the first connection body 60. Likewise, as shown in FIGS. 8 and 10, when the second electronic element 23 is the switching element such as the MOSFET, a second gate electrode 23g and a second source electrode 23s may be provided on a surface of the second electronic element adjacent to the second connection body 70. In this case, the second connection body 70 may be connected to the second source electrode 23s of the second electronic element 23 via the conductive adhesive 95. In addition, the first connection body 60 may connect the first source electrode 13s of the first electronic element 13 and a second drain electrode 23d provided on a surface of the second electronic element 23 opposite to the second connection body 70 via the conductive adhesive 95. A first drain electrode 13d may be provided on a surface of the first electronic element 13 opposite to the first connection body 60. The first gate electrode 13g shown in FIG. 9 may be connected to a connector 30 via the conductive adhesive 95, and the connector 30 may be connected to the first conductor layer 12 via the conductive adhesive 95. The second gate electrode 23g shown in FIG. 10 may be connected to a connector 40 via the conductive adhesive 95, and the connector 40 may be connected to the first conductor layer 12 via the conductive adhesive 95.

The terminals 110 and 150 and the conductor layers 12 and 22 may be bonded to each other using laser welding or may be bonded to each other using ultrasonic bonding, as well as an aspect of using the conductive adhesive 95 such as the solder.

<<Function and Effect>>

Next, an example of a function and effect according to the present embodiment having the abovementioned configuration will be described. It should be noted that all aspects described in the "function and effect" can be adopted in the above configuration.

In the present embodiment, when an aspect in stress relaxation terminals 150 exposed from the side surfaces of the sealing part 90 without being electrically connected to the electronic elements 13 and 23 are provided is adopted, it is possible to prevent the substrates 11 and 21 from being warped, particularly, peripheral parts of the substrates 11 and 21 from being warped toward an inner side of the sealing part. More specifically, in an aspect in which the stress relaxation terminals 150 are provided on the first substrate 11 side, it possible to prevent the peripheral part of the first substrate 11 from being warped upward, and in an aspect in which the stress relaxation terminals 150 are provided on the second substrate 21 side, it is possible to prevent the peripheral part of the second substrate 21 from being warped downward.

When an aspect in which the width of the stress relaxation terminal 150 is wider than the width of the control terminal 120 is adopted, it is possible to effectively suppress strain of the substrates 11 and 21 by the stress relaxation terminal. When a width of the stress relaxation terminal base end part 151 is 2 to 5 times the width of the control terminal base end part 121, more specifically, 2.5 to 4 times the width of the control terminal base end part 121, it is advantageous in that it is possible to effectively suppress the strain of the substrates 11 and while saving a space in a plane.

When an aspect in which the width of the stress relaxation terminal 150 is narrower than the width of the power terminal 130 is adopted, it is possible to save a space in the plane used for the stress relaxation terminal 150 that does not electrically function. It should be noted that the present invention is not limited to such an aspect, and the width of the stress relaxation terminal 150 may be the same as the width of the power terminal 130 or the width of the stress relaxation terminal 150 may be wider than the width of the power terminal 130. However, in these aspects, it should be noted that the space in the plane used for the stress relaxation terminal 150 that does not electrically function is required. As an example, when the width of the stress relaxation terminal base end part 151 is 1/5 to 1/15 times the width of the power terminal base end part 131, more specifically, 1/10 to 1/14 times the width of the power terminal base end part 131, it is advantageous in that it is possible to effectively suppress the strain of the substrates 11 and 21 while saving the space in the plane.

As shown in FIG. 5, when an aspect in which the stress relaxation terminal 150 has the stress relaxation terminal base end part 151 directly or indirectly provided on the second conductor layer 22, the stress relaxation terminal outer part 153 at least a portion of which is exposed from the sealing part 90, and the stress relaxation terminal bent part 152 provided between the stress relaxation terminal base end part 151 and the stress relaxation terminal outer part 153 and bent from the stress relaxation terminal base end part 151 toward one side is adopted, it is advantageous in that it is possible to prevent the strain of the second substrate 21 by physical force from the stress relaxation terminal 150 as well as to prevent the strain of the second substrate 21 by heat dissipation by the stress relaxation terminal 150.

As shown in FIG. 1, when the non-connected conductor layer 50 that is not electrically connected to the first electronic element 13 and the second electronic element 23 is provided on one side of the first substrate 11 the non-connected conductor layer 50 is pressed by the metal mold, and it is thus possible to prevent warpage of the first substrate 11. In particular, when the stress relaxation terminals 150 provided on the second substrate 21 side as described above are used and the non-connected conductor layer 50 provided on the first substrate 11 side is used, it is advantageous in that it is possible to prevent the strain in both of the first substrate 11 and the second substrate 21.

As shown in FIG. 4, when an aspect in which the power terminal 130 has the power terminal base end part 131 electrically connected to the second conductor layer 22, the power terminal outer part 133 at least a portion or which is exposed from the sealing part 90, and the power terminal bent part 132 provided between the power terminal base end part 131 and the power terminal outer part 133 and bent from the power terminal base end part 131 toward one side is adopted, it is advantageous in that it is also possible to prevent the strain of the second substrate 21 by physical force from the power terminal 130.

As shown in FIG. 1, when an aspect in which the stress relaxation terminals 150 are provided at the peripherally outer side of the power terminals 130 in the plane direction is adopted, it is possible to improve heat dissipation efficiency at the peripherally outer side, such that it is possible to prevent warpage of the substrates 11 and 21 at the peripherally outer side at which the strain easily occurs. In addition, heat is generated by the power terminals 130 at the time of driving, but the stress relaxation terminals 150 are provided at the peripherally outer side of the power terminals 130 in the plane direction as described above, such that it is possible to expect that the heat from the power terminals 130 is released to the peripherally outer side.

When an aspect in which at least one of the control terminals 120 goes beyond the third side surface 11c or the fourth side surface 11d of the first substrate 11 in the in-plane direction to extend to the peripheral outside or the first substrate 11 is adopted, it is possible to improve heat dissipation efficient by such a control terminal 120, such that it is possible to prevent the warpage of the substrates 11 and 21 in the peripherally outer side at which the strain easily occurs. In the aspect shown in FIG. 1, since the four control terminals 120a to 120d are provided to correspond to four corners of the first substrate 11, respectively, it is possible to more uniformly and efficiently improve the heat dissipation efficiency.

The heat dissipation may be balanced by providing a large number of stress relaxation terminals 150 on a side surface on which the number of power terminals 130 is large. In the aspect shown in FIG. 1, three power terminals 130 are provided on the first side surface 91 of the sealing part 90 (the first side surface 11a of the first substrate 11) and two power terminals 130 are provided on the second side surface 92 of the sealing part 90 (the second side surface 11b of the first substrate 11), therefore it is likely that the strain of the substrate 11 and 21 will occur on the side surface (the first side surface 91 in FIG. 1) on which the three power terminals 130 are provided. For this reason, two stress relaxation terminals 150 may be provided on the first side surface 91 (the first side surface 21a of the second substrate 21) on which it is likely that the strain of the substrates 11 and 21 will occur to prevent the occurrence of the strain in the substrates 11 and 21, and one stress relaxation terminal 150 may be provided on the second side surface 91 (the second side surface 21b of the second substrate 21) on which the two power terminals 130 are provided. In an aspect of providing the large number of stress relaxation terminals 150 on the side surface on which the number of power terminals 130 is large, the stress relaxation terminal 150 may not be provided on a side surface on which the number of power terminals 130 is small, and may not be provided on the second side surface 91 of FIG. 1 (the second side surface 21b of the second substrate 21).

Second Embodiment

Next, a second embodiment of the present invention will be described.

A stack structure in which the second electronic element 23 is provided on one side of the first electronic element 13 and an aspect in which the connection bodies 60 and 70 are provided have been described in the first embodiment, but in the present embodiment, the connection bodies 60 and 70 are not provided. In the present embodiment, all of the aspects described in the first embodiment can be adopted. The members described in the first embodiment will be described using the same reference numerals.

Also in the present embodiment, it is possible to obtain an effect of providing stress relaxation terminals 150, similarly to the first embodiment. As an example, when an aspect in which the stress relaxation terminal 150 has a stress relaxation terminal base end part 151 provided on a second conductor layer 22 via a conductive adhesive 95, a stress relaxation terminal outer part 153 at least a portion of which is exposed from a sealing part 90, and a stress relaxation terminal bent part 152 provided between the stress relaxation terminal base end part 151 and the stress relaxation terminal outer part 153 and bent from the stress relaxation terminal base end part 151 toward one side is adopted, it is advantageous in that it is possible to prevent strain of a second substrate 21 by physical force from the stress relaxation terminal 150 as well as to prevent the strain of the second substrate 21 by heat dissipation by the stress relaxation terminal 150.

Third Embodiment

Next, a third embodiment of the present invention will be described.

A stack structure in which the second electronic element 23 is provided on one side of the first electronic element 13 and an aspect in which the connection bodies 60 and 70 are provided have been described in the first embodiment, but in the present embodiment, the stack structure is not used, and an aspect in which a first electronic element 13 is provided, but a second electronic element 23 is not provided is adopted. In addition, an aspect in which a second substrate 21 is also not provided is adopted. In the present embodiment, an aspect in which a stress relaxation terminal 150 is connected to a first conductor layer 13 is adopted. In the present embodiment, all of the aspects described in the respective embodiments described above can be adopted.

The members described in the respective embodiments described above will be described using the same reference numerals.

Figure 12:
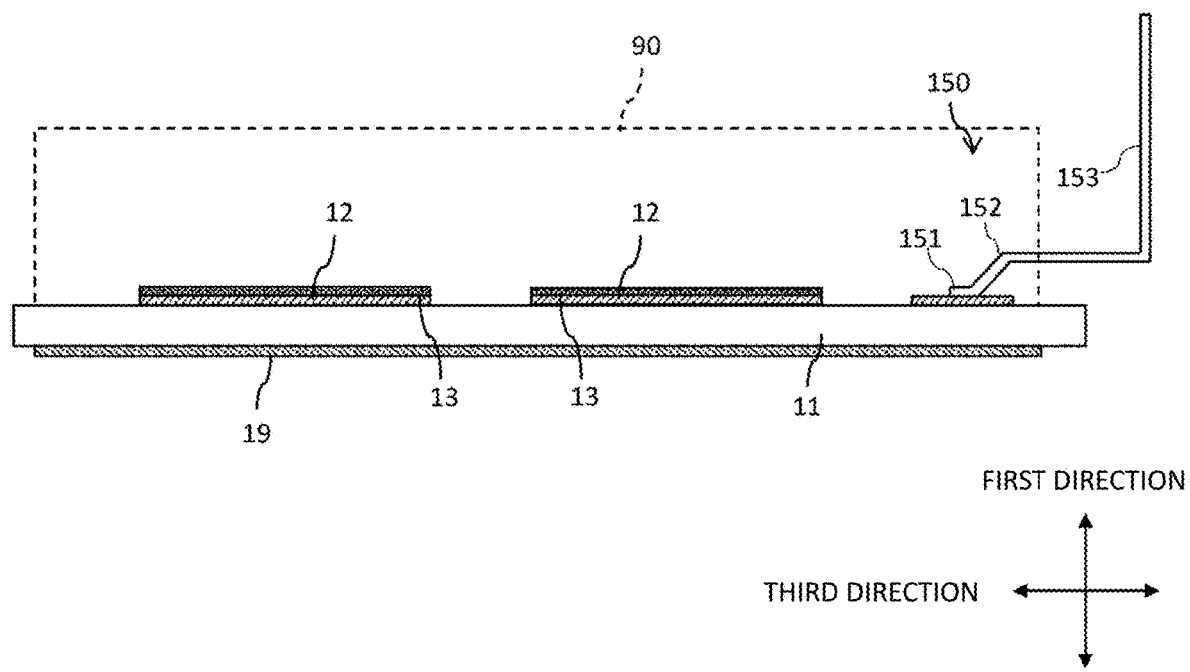
FIG. 12 is a view corresponding to FIG. 8, and is a side cross-sectional view of an electronic module that can be used in a third embodiment of the present invention.

Also in the present embodiment, it is possible to obtain an effect of providing the stress relaxation terminal 150, and it is possible to prevent strain of a first substrate 11 by heat dissipation by the stress relaxation terminal 150, similarly to the first embodiment. In the present embodiment, a stress relaxation terminal base end part 151 is provided on a first conductor layer 12 via a conductive adhesive 95 (not shown in FIG. 12).

The disclosures of the descriptions and drawings of the above-described embodiments are merely examples for explaining the inventions described in the claims, and the inventions are not limited by the disclosures of the descriptions or drawings of the above-described embodiments. In addition, the descriptions of the claims at the beginning of the application are merely examples, and the descriptions of the claims can be appropriately changed based on the descriptions of the specification and the drawings.

REFERENCE SIGNS LIST 11 first substrate
13 first electronic element
21 second substrate
22 second conductor layer
23 second electronic element
50 non-connected conductor layer
90 sealing part
120 control terminal (connection terminal)
130 power terminal (connection terminal)
131 power terminal base end part
132 power terminal bent part
133 power terminal outer part
150 stress relaxation terminal
151 stress relaxation terminal base end part
152 stress relaxation terminal bent part
153 stress relaxation terminal outer part

The invention claimed is:

1. An electronic module comprising:
   a first substrate;
   an electronic element provided on one side of the first substrate;
   a sealing part that seals at least the electronic element;
   a connection terminal electrically connected to the electronic element and exposed from a side surface of the sealing part; and
   a stress relaxation terminal, which is not electrically connected to the electronic element, exposed from the side surface of the sealing part, wherein
   the connection terminal has a control terminal for inputting a control signal to the electronic element.

2. The electronic module according to claim 1, wherein
   the connection terminal has a power terminal for supplying power to the electronic element and
   a width of the stress relaxation terminal is narrower than a width of the power terminal.

3. The electronic module according to claim 1, wherein
   the electronic element has a first electronic element and a second electronic element provided on one side of the first electronic element,
   the stress relaxation terminal is not electrically connected to the first electronic element and the second electronic element.

4. The electronic module, according to claim 3, further comprising:

a second conductor layer provided on one side of the second electronic element; and a second substrate provided on one side of the second conductor layer, wherein the stress relaxation terminal has a stress relaxation terminal base end part provided on the second conductor layer, a stress relaxation terminal outer part at least a portion of which is exposed from the sealing part, and a stress relaxation terminal bent part provided between the stress relaxation terminal base end part and the stress relaxation terminal outer part and bent toward one side at a side of the stress relaxation terminal base end part.

5. The electronic module according to claim 4, a non-connected conductor layer that is not electrically connected to the first electronic element and the second electronic element is provided on one side of the first substrate.

6. The electronic module according to claim 1, wherein the connection terminal has a plurality of power terminals for supplying power to a first electronic element or a second electronic element, and at least one power terminal has a power terminal base end part electrically connected to a second conductor layer, a power terminal outer part at least a portion of which is exposed from the sealing part, and a power terminal bent part provided between the power terminal base end part and the power terminal outer part and bent toward one side at a side of the power terminal base end part.

7. The electronic module according to claim 1, wherein the connection terminal has a power terminal for supplying power to a first electronic element or a second electronic element, and the stress relaxation terminal is provided at a peripherally outer side of the power terminal in a plane direction.

8. The electronic module according to claim 1, wherein the connection terminal has a plurality of control terminals for inputting a control signal to a first electronic element or a second electronic element, the stress relaxation terminal goes beyond in an in-plane direction a first side surface or a second side surface, which is a side surface in an opposite side of the first side surface, of the first substrate, and extends to a peripheral outside of the first substrate, the first substrate has a third side surface and a fourth side surface extending between the first side surface and the second side surface, at least one of the control terminals goes beyond in an in-plane direction the third side surface or the fourth side surface of the first substrate, and extends to a peripheral outside of the first substrate.

* * * * *